(12) United States Patent
Jeong et al.

(10) Patent No.: US 10,938,392 B2
(45) Date of Patent: Mar. 2, 2021

(54) TRANSMITTER FOR TRANSMITTING MULTI-BIT DATA

(71) Applicants: SK hynix Inc., Icheon (KR); Seoul National University R&DB Foundation, Seoul (KR)

(72) Inventors: Yongun Jeong, Seoul (KR); Suhwan Kim, Seoul (KR)

(73) Assignees: SK hynix Inc., Icheon (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 16/694,969

(22) Filed: Nov. 25, 2019

(65) Prior Publication Data

US 2020/0382121 A1    Dec. 3, 2020

(30) Foreign Application Priority Data

May 30, 2019   (KR) .................. 10-2019-0063587

(51) Int. Cl.
   *H03K 19/00*    (2006.01)
   *G11C 11/4096*  (2006.01)
   *G11C 11/4074*  (2006.01)
   *H03K 19/013*   (2006.01)

(52) U.S. Cl.
   CPC ...... *H03K 19/0005* (2013.01); *G11C 11/4074* (2013.01); *G11C 11/4096* (2013.01); *H03K 19/0136* (2013.01)

(58) Field of Classification Search
   None
   See application file for complete search history.

(56) References Cited

U.S. PATENT DOCUMENTS

| | | | |
|---|---|---|---|
| 9,859,869 B1 * | 1/2018 | Lee ................. | H03H 11/28 |
| 2010/0060317 A1 * | 3/2010 | Ahn ................. | G11C 7/1051 |
| | | | 326/30 |
| 2014/0016404 A1 * | 1/2014 | Kim ................. | G11C 7/1057 |
| | | | 365/158 |
| 2015/0372679 A1 * | 12/2015 | Kee ................. | G05F 1/462 |
| | | | 327/543 |
| 2019/0043543 A1 | 2/2019 | Butterfield | |
| 2019/0044769 A1 | 2/2019 | Hollis | |
| 2019/0096450 A1 * | 3/2019 | Jung .............. | H03K 19/017545 |

* cited by examiner

*Primary Examiner* — Crystal L Hammond

(57) ABSTRACT

A transmitter includes a driver circuit configured to drive a channel connected to a first node by controlling a turn-on impedance of a pull-up path, a turn on impedance of a pull-down path, or both according to a plurality of control signals; an encoder configured to generate the plurality of control signals according to a multi-bit data and a calibration signal; and a calibration circuit configured to generate the calibration signal including calibration information corresponding to the plurality of control signals, wherein the encoder determines activation and magnitude of each of the plurality of control signals according to the multi-bit data and the calibration information.

20 Claims, 20 Drawing Sheets

FIG. 2
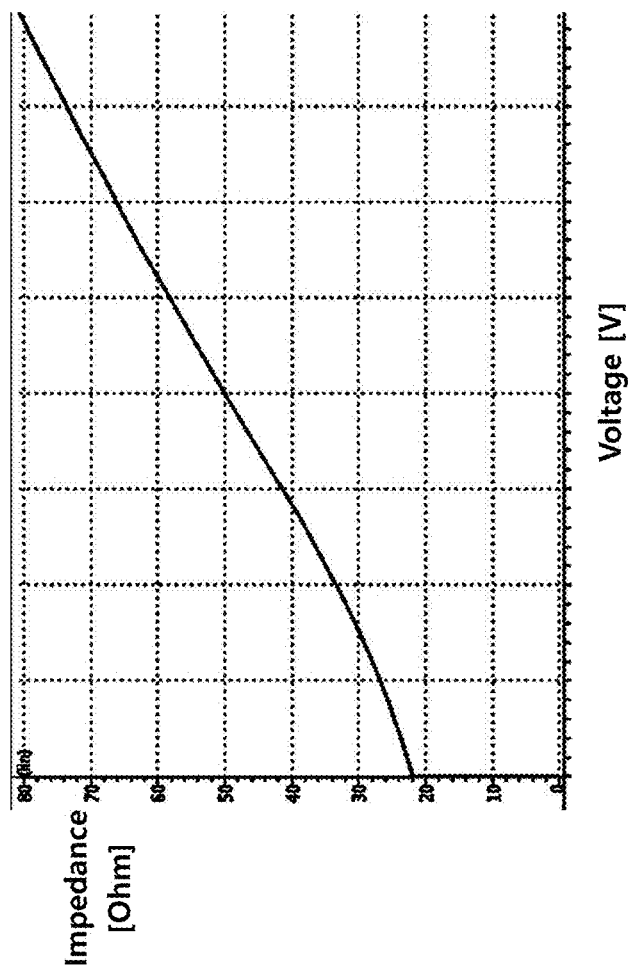
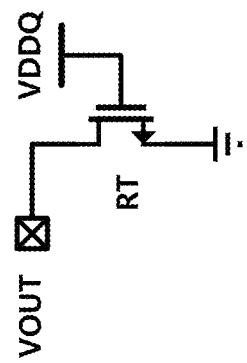

TRANSMITTER FOR TRANSMITTING MULTI-BIT DATA

CROSS-REFERENCE TO RELATED APPLICATION

The present application claims priority under 35 U.S.C. § 119(a) to Korean Patent Application No. 10-2019-0063587, filed on May 30, 2019, which are incorporated herein by reference in its entirety.

BACKGROUND

1. Technical Field

Various embodiments may relate to a transmitter for transmitting multi-bit data.

2. Related Art

In order to transmit data at high speed, multi-bit data is transmitted.

For example, a four-level pulse amplitude modulation (PAM-4) signal is a multi-level signal having four levels corresponding to 2-bit data.

FIG. 1 includes eye diagrams showing a comparison of the PAM-2 signal and the PAM-4 signal.

The PAM-2 signal is a binary signal with a wide gap between the signals.

However, multi-level signals such as PAM-4 are vulnerable to noise because the gap between levels in the vertical direction (here, the differences in voltage levels) is narrower than for a PAM-2 signal.

FIG. 2 illustrates a phenomenon in which the impedance of a termination resistor of the receiver (here, a resistor formed using an on resistance of a MOSFET) depends on the magnitude of the output voltage.

When transmitting multi-bit data, output voltage varies depending on the data, and as a result, the impedance of the termination resistor depends on the data.

As a result, the signal levels may not be evenly arranged in the eye diagram, thereby degrading the linearity of the transmitter.

SUMMARY

In accordance with an embodiment of the present disclosure, a transmitter may include a driver circuit configured to drive a channel connected to a first node by controlling a turn-on impedance of a pull-up path and/or a pull-down path according to a plurality of control signals; an encoder configured to generate the plurality of control signals according to a multi-bit data and a calibration signal; and a calibration circuit configured to generate the calibration signal including calibration information corresponding to the plurality of control signals, wherein the encoder determines activation and magnitude of each of the plurality of control signals according to the multi-bit data and the calibration information.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed novelty, and explain various principles and advantages of those embodiments.

FIG. 2 is a graph showing a relation between output voltage and impedance of a termination resistor.

DETAILED DESCRIPTION

Various embodiments will be described below with reference to the accompanying figures. Embodiments are provided for illustrative purposes and other embodiments that are not explicitly illustrated or described are possible. Further, modifications can be made to embodiments of the present disclosure that will be described below in detail.

Figure 1:
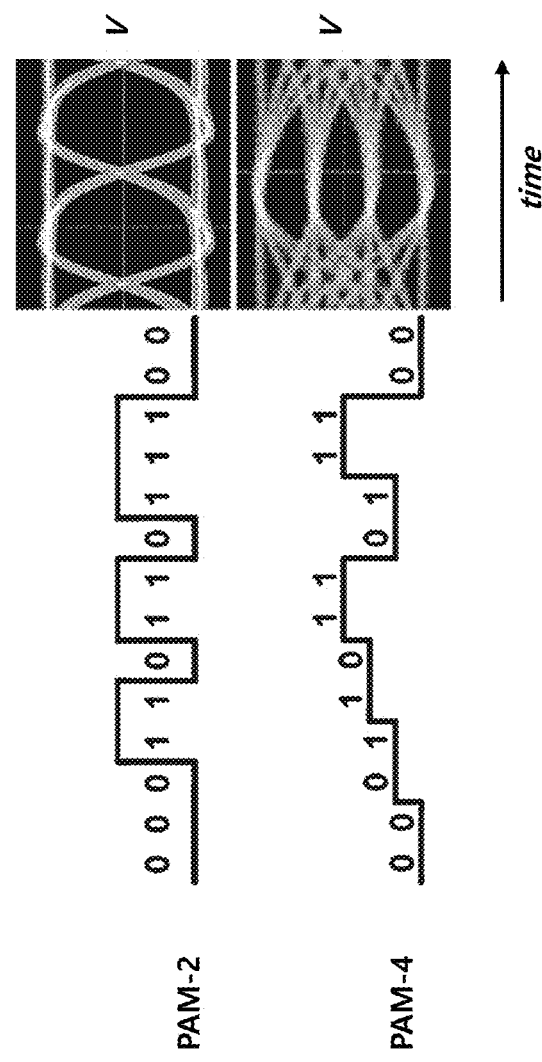
FIG. 1 illustrates a PAM-2 signal and a PAM-4 signal.
Figure 3:
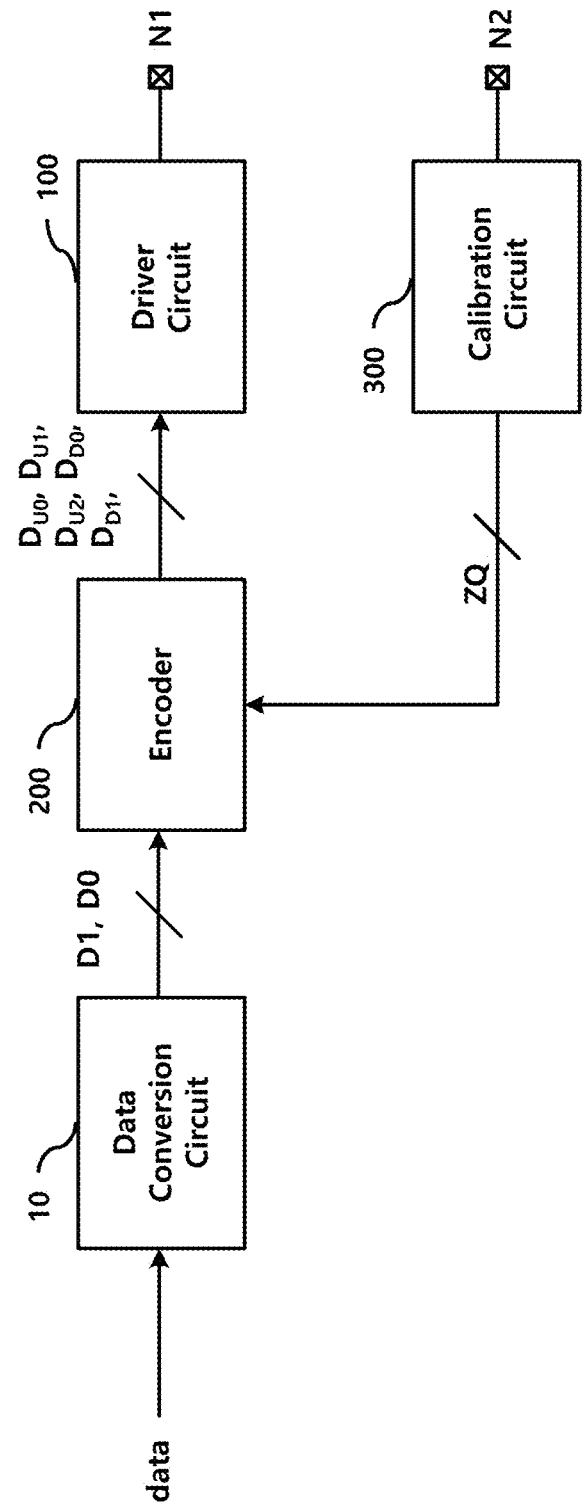
FIG. 3 is a block diagram of a transmitter according to an embodiment of the present disclosure.

FIG. 3 is a block diagram of a transmitter 33 according to an embodiment of the present disclosure.

Hereinafter, a transmitter 33 for transmitting 2-bit data will be described as an example. A most significant bit of the 2-bit data is represented as D1 and a least significant bit of the 2-bit data is represented as D0.

The transmitter 33 according to an embodiment of the present disclosure includes a driver circuit 100, an encoder 200, and a calibration circuit 300.

The driver circuit 100 drives a channel connected to the first node N1 according to a plurality of control signals $D_{U0}$, $D_{U1}$, $D_{U2}$, $D_{D0}$, and $D_{D1}$. The first node N1 may also be referred to as an output node.

In the present embodiment, each of the plurality of control signals $D_{U0}$, $D_{U1}$, $D_{U2}$, $D_{D0}$, and $D_{D1}$ is a multi-bit digital signal, and hereinafter, each of the plurality of control signals $D_{U0}$, $D_{U1}$, $D_{U2}$, $D_{D0}$, and $D_{D1}$ may also be referred to as a multi-bit control signal.

Each of the multi-bit control signals $D_{U0}$, $D_{U1}$, and $D_{U2}$ are used to control a respective pull up driver circuit included in the driver circuit 100, and each of the multi-bit signals $D_{D0}$ and $D_{D1}$ are used to control a respective a pull down driver circuit included in the driver circuit 100.

The encoder 200 encodes the multi-bit data D1, D0 according to the calibration signal ZQ provided from the calibration circuit 300 to produce the multi-bit control signals $D_{U0}$, $D_{U1}$, $D_{U2}$, $D_{D0}$, and $D_{D1}$ that control the driver circuit 100.

The calibration circuit 300 performs a calibration operation to determine the calibration signal ZQ according to levels of the output signal.

The determined calibration signal ZQ is provided to the encoder 100 and used to determine the plurality of multi-bit control signals $D_{U0}$, $D_{U1}$, $D_{U2}$, $D_{D0}$, and $D_{D1}$.

A calibration resistor may be connected to the second node N2 of the calibration circuit 300. The second node N2 may be referred to as a calibration node.

Detailed configurations and operations of the driver circuit 100, the encoder 200, and the calibration circuit 300 will be described below.

The transmitter may further include a data conversion circuit 10 for converting the input data into multi-bit data.

The data conversion circuit 10 may be implemented by a person skilled in the art using a conventionally known technique such as a data serialization circuit, and a detailed description thereof will be omitted.

Figure 4:
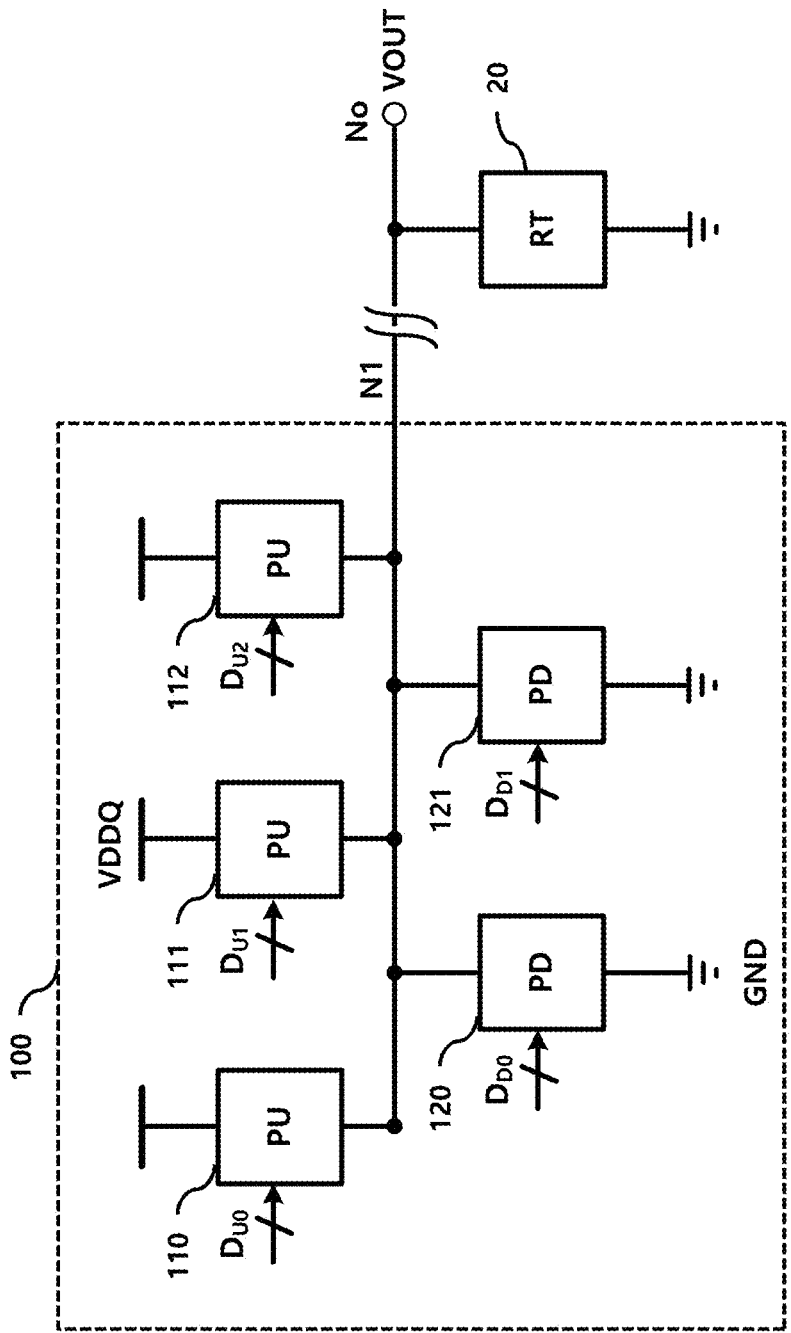
FIGS. 4, 5, and 6 illustrate driver circuits according to embodiments of the present disclosure.

FIG. 4 is a block diagram illustrating a driver circuit 100 according to an embodiment of the present disclosure.

The driver circuit 100 includes a plurality of pull-up driver circuits 110, 111, and 112 connected between the power supply VDDQ and the first node N1, and a plurality of pull-down driver circuits 120 and 121 connected between the ground GND and the first node N1.

Hereinafter, the power supply VDDQ may be referred to as a first power supply, and the ground GND may be referred to as a second power supply.

In FIG. 4, each pull-up driver circuit is briefly represented as a PU and each pull-down driver circuit is represented by a PD.

A respective multi-bit control signal among a plurality of multi-bit control signals $D_{U0}$, $D_{U1}$, $D_{U2}$, $D_{D0}$, and $D_{D1}$ is applied to the pull-up driver circuits PU and the pull-down drivers circuit PD.

For example, the multi-bit control signal $D_{U0}$ is applied to the pull-up driver circuit 110, the multi-bit control signal $D_{U1}$ is applied to the pull-up driver circuit 111, the multi-bit control signal $D_{U2}$ is applied to the pull-up driver circuit 112, the multi-bit control signal $D_{D0}$ is applied to the pull-down driver circuit 120, and the multi-bit control signal $D_{D1}$ is applied to the pull-down driver circuit 121.

In FIG. 4, the voltage of the output node No of the receiver connected to the first node N1 through the channel is represented as an output voltage VOUT, and the termination resistor 20 included in the receiver is connected between the output node No and ground. In FIG. 4, the termination resistor 20 of the receiver is represented by RT.

In the driver circuit 100, the number of pull-up driver circuits and pull-down driver circuits may vary in various embodiments.

Figure 5:
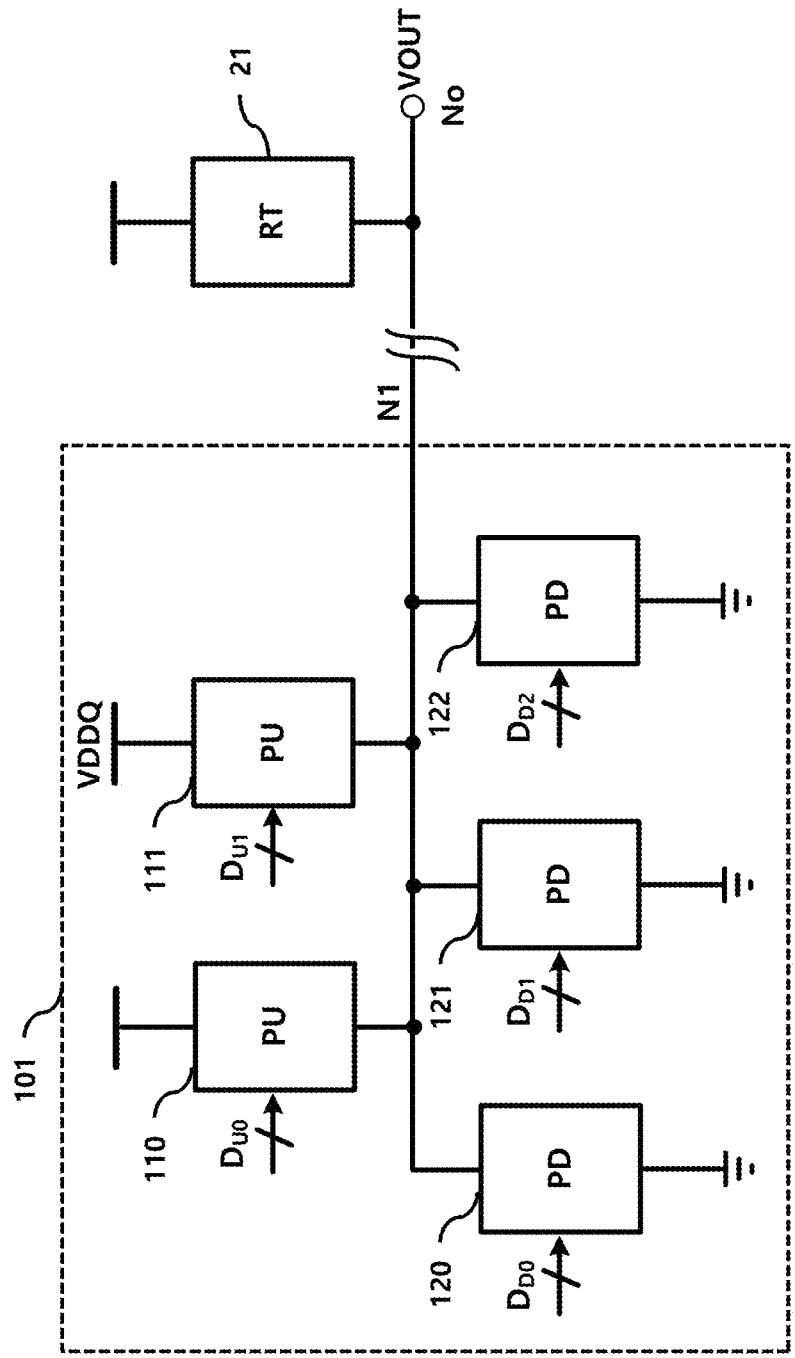

FIG. 5 shows a driver circuit 101 according to another embodiment of the present disclosure.

In the embodiment of FIG. 5, unlike the embodiment of FIG. 4, the number of pull-up driver circuits 110 and 111 is two and the number of pull-down driver circuits 120, 121, and 122 is three.

In addition, the embodiment of FIG. 5 is different from the embodiment of FIG. 4 in that the termination resistor 21 of the receiver is connected between the power supply and the output node No.

In the embodiment of FIG. 5, the multi-bit control signal $D_{U0}$ is applied to the pull-up driver circuit 110, the multi-bit control signal $D_{U1}$ is applied to the pull-up driver circuit 111, the multi-bit control signal $D_{D0}$ is applied to the pull-down driver circuit 120, the multi-bit control signal $D_{D1}$ is applied to the pull-down driver circuit 121, and the multi-bit control signal $D_{D2}$ is applied to the pull-down driver circuit 122.

Figure 6:
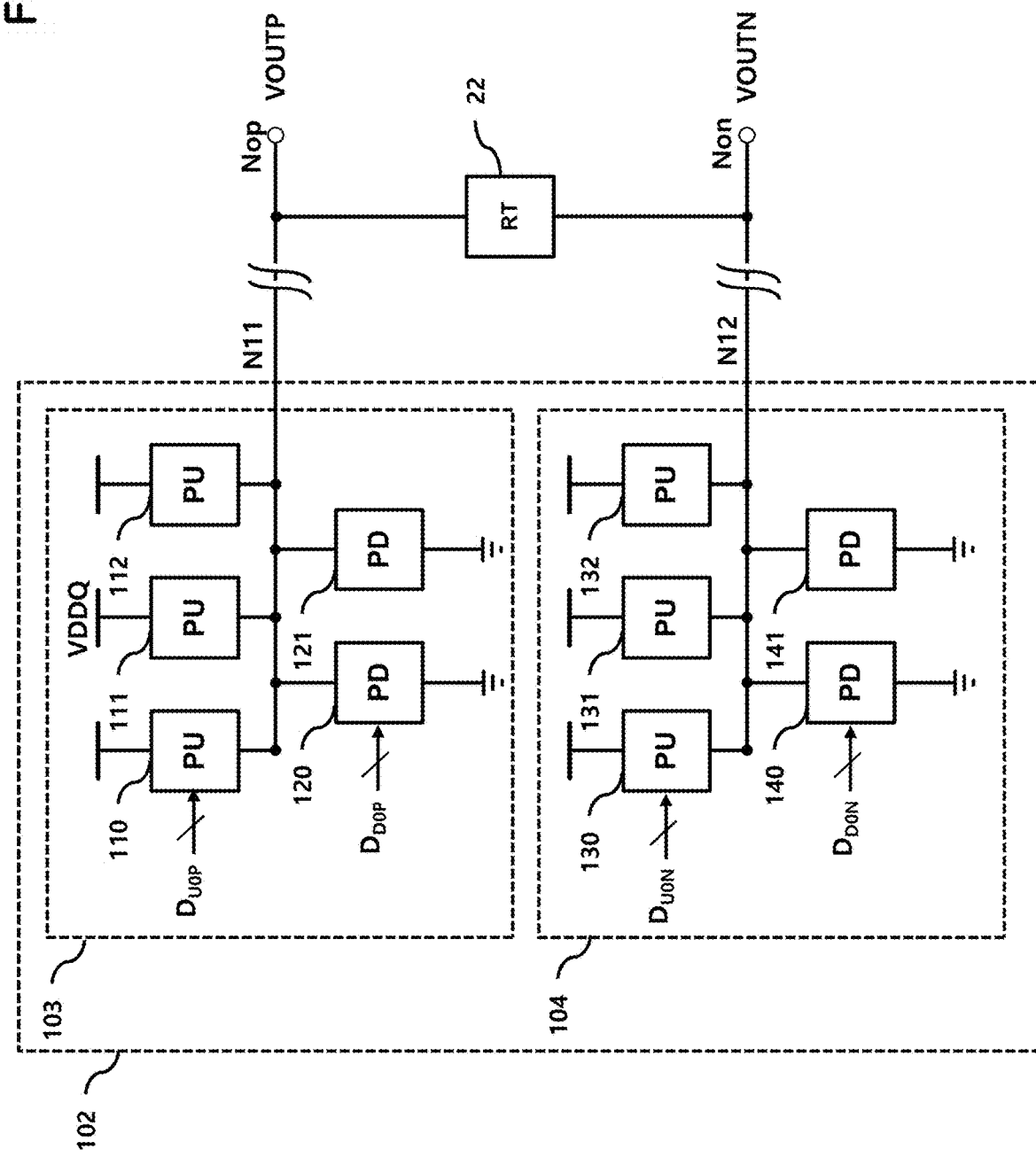

FIG. 6 shows a driver circuit 102 according to another embodiment of the present disclosure.

The embodiment of FIG. 6 is a differential driver circuit 102.

The driver circuit 102 includes a first driver circuit 103 for generating one of the differential output signals and a second driver circuit 104 for generating the other of the differential output signals.

Each of the first driver circuit 103 and the second driver circuit 104 has a configuration substantially as same as that of the driver circuit 100 of FIG. 4.

The first driver circuit 103 includes pull-up driver circuits 110, 111, and 112, and includes pull-down driver circuits 120 and 121.

In the first driver circuit 103, the multi-bit control signal $D_{U0P}$ is input to the pull-up driver circuit 110, and the multi-bit control signal $D_{D0P}$ is input to the pull-down driver circuit 120. Other corresponding multi-bit control signals are also applied to the remaining pull-up driver circuits 111 and 112 and the pull-down driver circuit 121.

The second driver circuit 104 includes pull-up driver circuits 130, 131, and 132 and pull-down driver circuits 140 and 141.

In the second driver circuit 104, the multi-bit control signal $D_{U0N}$ is input to the pull-up driver circuit 130, and the multi-bit control signal $D_{D0N}$ is input to the pull-down driver circuit 140. Other corresponding multi-bit control signals are also applied to the remaining pull-up driver circuits 131 and 132 and the pull-down driver circuit 141.

In the embodiment of FIG. 6, the driver circuit 102 includes an eleventh node N11 which is one of the differential output nodes and a twelfth node N12 which is the other of the differential output nodes.

The eleventh node N11 transfers output of the first driver circuit 103 to the first output node Nop of the receiver through a first channel, and the twelfth node N12 transfers output of the second driver circuit 104 to the second output node Non of the receiver through a second channel.

In the receiver, the termination resistor 22 is connected between the first output node Nop and the second output node Non.

In FIG. 6, voltage output from the first output node Non is represented by VOUTP, and voltage output from the second output node Non is represented by VOUTN.

As described above, the detailed configuration of the driver circuit 100 may be variously changed.

Hereinafter, an embodiment will be described based on the driver circuit 100 illustrated in FIG. 4.

Figure 7:
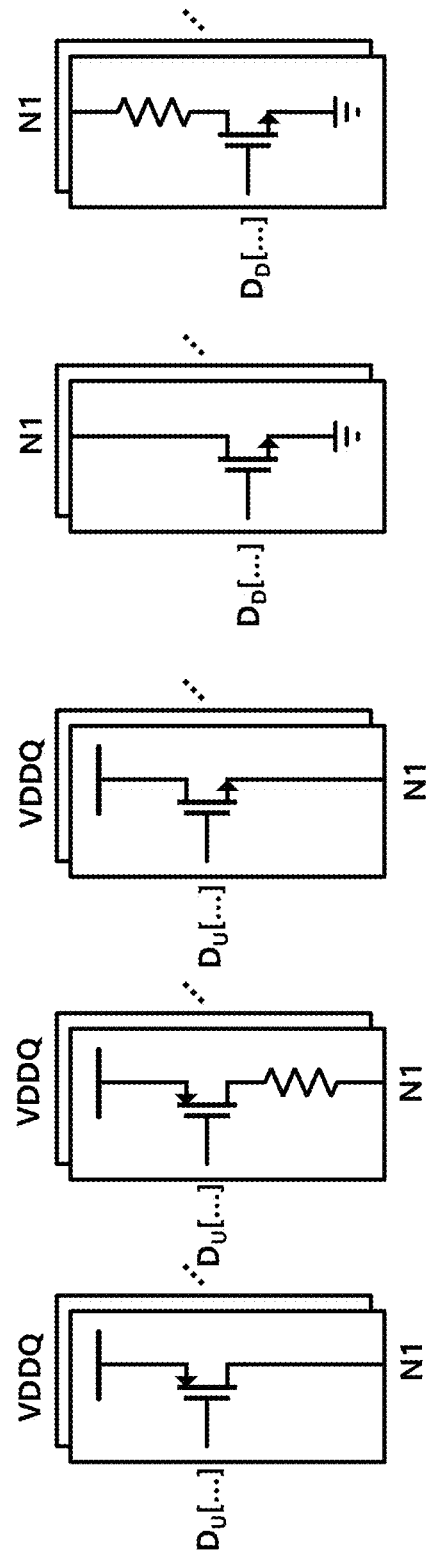
FIGS. 7A, 7B, 7C, 7D, and 7E illustrate pull-up driver circuits and pull-down driver circuits according to embodiments of the present disclosure.

FIGS. 7A to 7E are circuit diagrams each showing a pull-up driver circuit or a pull-down driver circuit according to an embodiment of the present disclosure. FIGS. 7A to 7C show pull-up driver circuits, and FIGS. 7D and 7E show pull-down driver circuits.

In each pull-up driver circuit, a number of circuits corresponding to the number of bits of the multi-bit control signal provided to the pull-up driver circuit are connected in parallel between the power supply VDDQ and the first node N1 and each of them is controlled by a corresponding bit of a multi-bit control signal $D_U$. An on resistance of each pull-up driver circuit is determined by how many of the parallel-connected circuits are turned on.

In each pull-down driver circuit, a number of circuits corresponding to the number of bits of the multi-bit control signal provided to the pull-down driver are connected in parallel between the ground GND and the first node N1 and each of them is controlled by a corresponding bit of a multi-bit control signal $D_D$. An on resistance of each pull-down driver circuit is determined by how many of the parallel-connected circuits are turned on.

In an embodiment, the pull-up driver circuit may include a plurality of PMOS transistors connected in parallel as shown in FIG. 7A. In another embodiment, the pull-up driver circuit may include a plurality of pairs connected in parallel, each pair including a PMOS transistor and a resistor connected in series as shown in FIG. 7B. In another embodiment, the pull-up driver circuit may include a plurality of N-channel MOS (NMOS) transistors connected in parallel as shown in FIG. 7C.

In an embodiment, the pull-down driver circuit may include a plurality of NMOS transistors connected in parallel as shown in FIG. 7D. In another embodiment, the pull-down driver circuit may include a plurality of pairs connected in parallel, each pair including a resistor and a NMOS transistor connected in series as shown in FIG. 7E.

In the illustrative embodiment presented herein, each of the pull-up driver circuits 110 to 112 has a structure as shown in FIG. 7C, and each of the pull-down driver circuits 120 and 121 has a structure as shown in FIG. 7D, but embodiments are not limited thereto.

Figure 8:
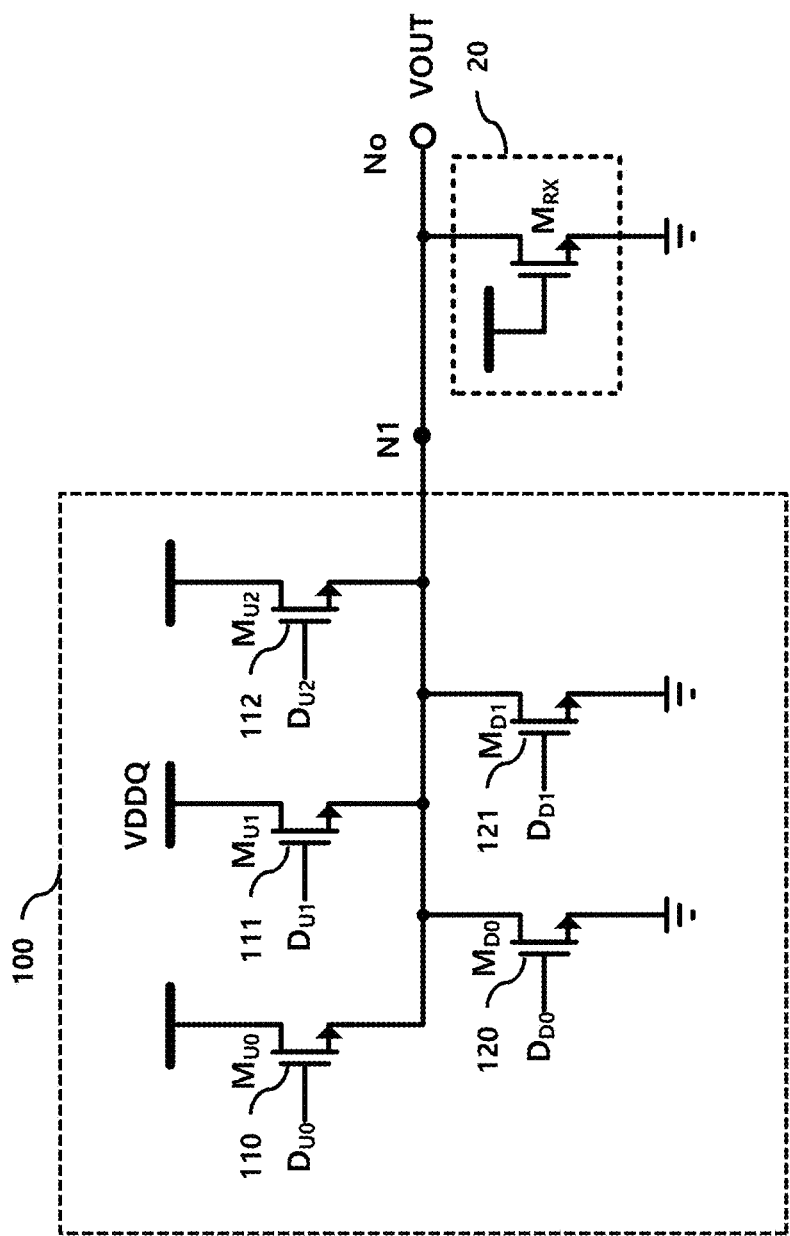
FIGS. 8, 9, 10, 11, and 12 illustrate operations of a driver circuit according to an embodiment of the present disclosure.

FIG. 8 is a circuit diagram illustrating a termination circuit 20 of a receiver and a driver circuit 100 in which both a pull-up driver circuit and a pull-down driver circuit are implemented with NMOS transistors.

For convenience, only one NMOS transistor is shown in each of the pull-up driver circuit and the pull-down driver circuit. However, it is apparent from the foregoing description that a plurality of NMOS transistors are connected in parallel, and corresponding bits of a multi-bit control signal are input to each gate.

A person skilled in the art can derive an embodiment in which the pull-up driver circuit and the pull-down driver circuit each include one NMOS transistor, and the control signal applied to each gate is variably adjusted as an analog signal. In the following, however, the embodiment in which the control signal is analog is omitted.

In FIG. 8, the pull-up driver circuit 110 includes NMOS transistors $M_{U0}$ each having a gate to which a bit of a control signal $D_{U0}$ is respectively applied and a source and a drain that are connected between a power supply VDDQ and a first node N1.

The pull-up driver circuit 111 includes an NMOS transistors $M_{U1}$ each having a gate to which a bit of a control signal $D_{U1}$ is respectively applied and a source and a drain that are connected between a power supply VDDQ and a first node N1.

The pull-up driver circuit 112 includes NMOS transistors $M_{U2}$ each having a gate to which a bit of a control signal $D_{U2}$ is respectively applied and a source and a drain that are connected between a power supply VDDQ and a first node N1.

The pull-down driver circuit 120 includes NMOS transistors $M_{D0}$ each having a gate to which a bit of a control signal $D_{D0}$ is respectively applied and a source and a drain that are connected between a first node N1 and a ground.

The pull-down driver circuit 121 includes NMOS transistors $M_{D1}$ each having a gate to which a bit of a control signal $D_{D1}$ is respectively applied and a source and a drain that are connected between a first node N1 and a ground.

In FIG. 8, the termination resistor 20 of the receiver includes an NMOS transistor $M_{RX}$ having a source and a drain connected between an output node No and a ground and a gate connected to a power supply.

FIGS. 9 to 12 are diagrams for explaining the operation of the driver circuit 100 of FIG. 8.

Figure 9:
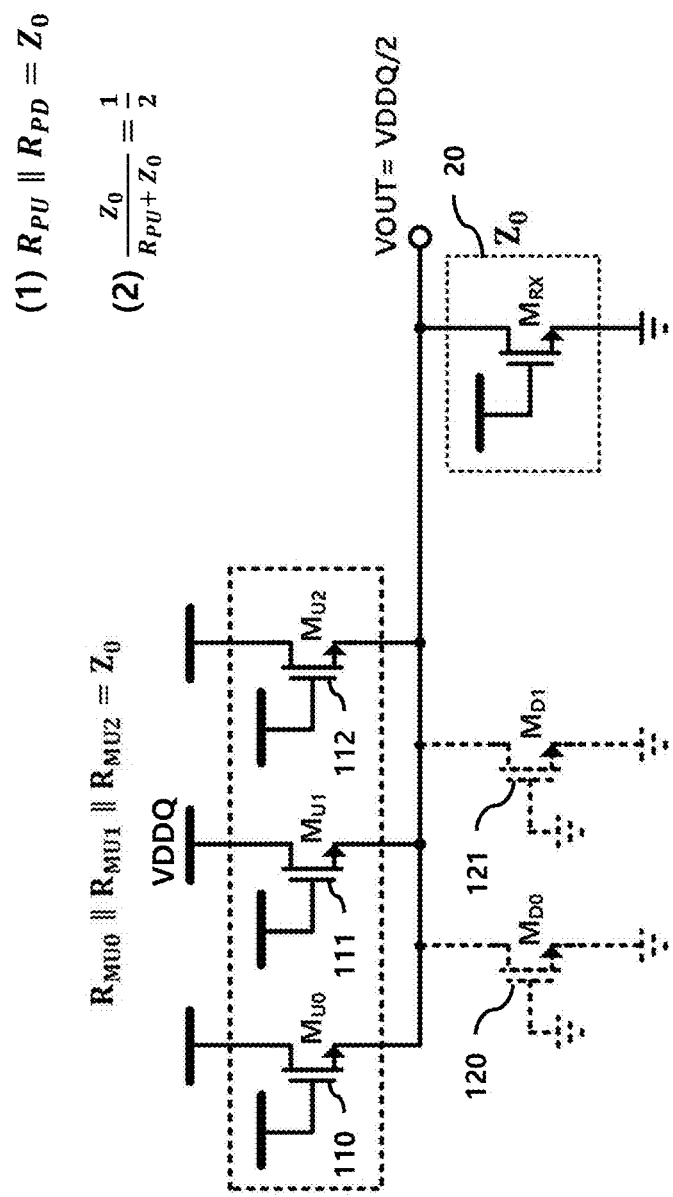

FIG. 9 illustrates a case where the multi-bit data input to the encoder 200 are "11".

When the multi-bit data is "11", the driver circuit 100 produces the output voltage VOUT having a value of one half of the power supply voltage VDDQ.

When the multi-bit data is "11", the pull-up driver circuits 110 to 112 are all turned on and the pull-down driver circuits 120 and 121 are all turned off.

In the figures, a pull-up driver circuit or a pull-down driver circuit in the turn-off state is indicated by a dotted line.

The number of NMOS transistors turned on in each of the pull-up drive circuits 110 to 112 is determined by a (previously performed) calibration operation.

An impedance of each of the pull-up driver circuits 110 to 112 may be adjusted according to the number of turned-on NMOS transistors.

The calibration operation will be described later in detail.

In FIG. 9, the impedance of the pull-up driver circuit 110 is represented by $R_{MU0}$, the impedance of the pull-up driver circuit 111 is represented by $R_{MU1}$, and the impedance of the pull-up driver circuit 112 is represented by $R_{MU2}$.

In addition, when the multi-bit data is "11", it is assumed that the impedance of the termination resistor 20 is $Z_o$ equal to the characteristic impedance of the channel.

In FIG. 9, the driver circuit 100 must satisfy two conditions as shown in the drawing.

First, the output impedance of the driver circuit 100 should be equal to the characteristic impedance $Z_o$ of the channel. This is a general requirement for maximum power delivery.

In FIG. 9, $R_{PU}$ represents impedance of the entire pull-up driver circuit and $R_{PD}$ represents impedance of the entire pull-down driver circuit.

Since the DC level VDDQ/2 of the output voltage VOUT of the receiver is a division of the power supply voltage VDDQ by pull-up impedance, pull-down impedance and termination resistance, the second condition must be satisfied.

Accordingly, total impedance $R_{MU0}\|R_{MU1}\|R_{MU2}$ (wherein "x∥y" is an impedance resulting from connecting impedances x and y in parallel) of the entire pull-up driver circuits 110 to 112 is controlled to be equal to $Z_o$.

Figure 10:
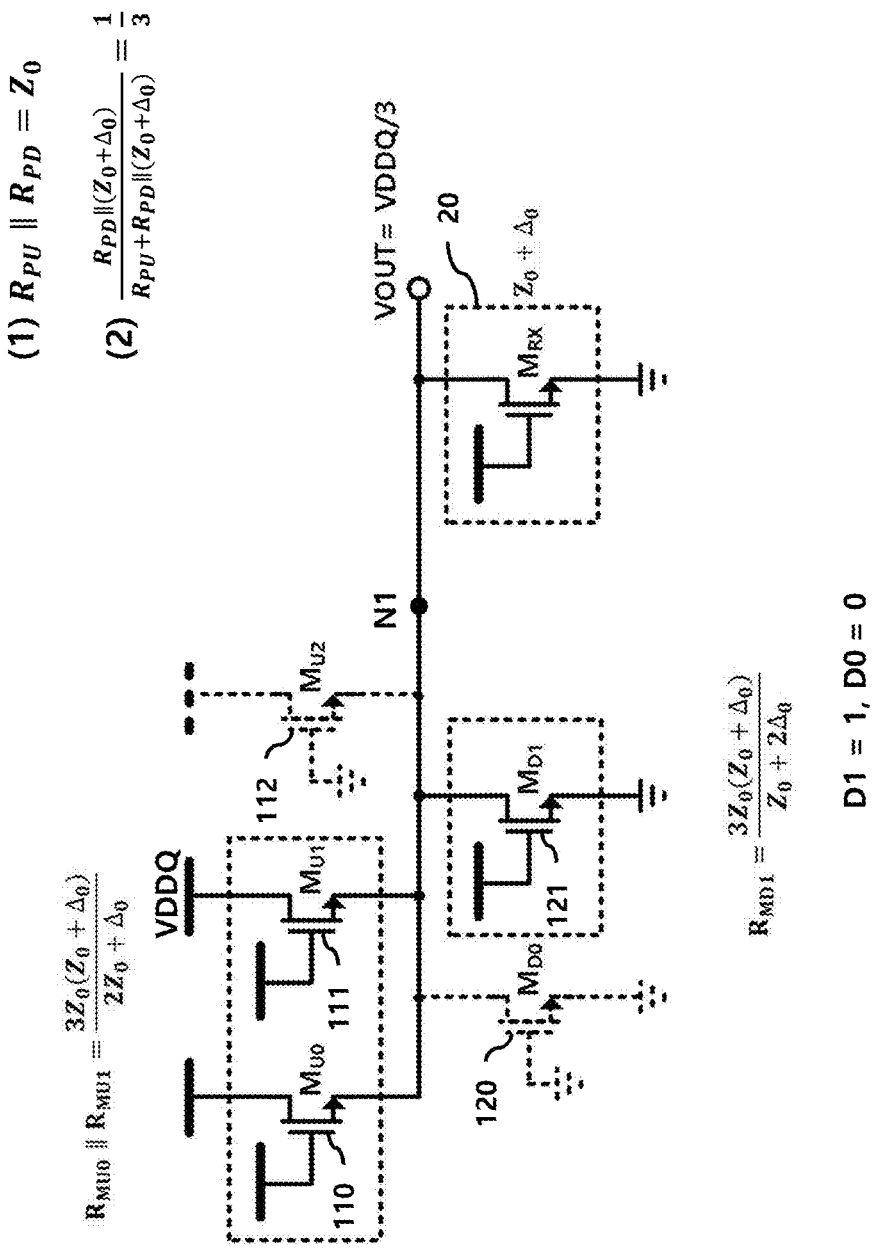

FIG. 10 shows a case where the multi-bit data input to the encoder 200 is "10".

When the multi-bit data is "10", the driver circuit 100 produces the output voltage VOUT having a value of one third of the power supply voltage VDDQ.

In the present embodiment, when the multi-bit data is "10", the pull-up driver circuits 110 and 111 and the pull-down driver circuit 121 are turned on, and the pull-up driver circuit 112 and the pull-down driver circuit 120 are turned off.

As described above, the number of NMOS transistors turned on in each of the pull-up driver circuits 110 and 111 and the pull-down driver circuit 121 is determined by a calibration operation.

In FIG. 10, impedance of the pull-down driver circuit 121 is represented by $R_{MD1}$.

In addition, when the multi-bit data is "10", it is assumed that impedance of the termination resistor 20 is changed to $Z_o+\Delta_0$ due to the change of the output voltage VOUT (as illustrated in the graph of FIG. 2).

As in FIG. 9, the driver circuit 100 must satisfy two conditions.

First, the output impedance of the drive circuit 100 should be equal to the characteristic impedance $Z_o$ of the channel. This is a general requirement for maximum power delivery.

Since the DC level VDDQ/3 of the receiver's output voltage VOUT is a division of the supply voltage VDDQ by pull-up impedance, pull-down impedance and termination resistance, a second condition must be satisfied.

Given the above two conditions, the composite impedance of the pull-up driver circuit ($R_{PU}=R_{MU0}||R_{MU1}$) and the composite impedance of the pull-down driver circuit ($R_{PD}=R_{MD1}$) can be expressed using $Z_o$ and $\Delta_0$.

These expressions are shown in FIG. 10, and the expression development process is known by those skilled in the art, and thus descriptions thereof are omitted.

Figure 11:
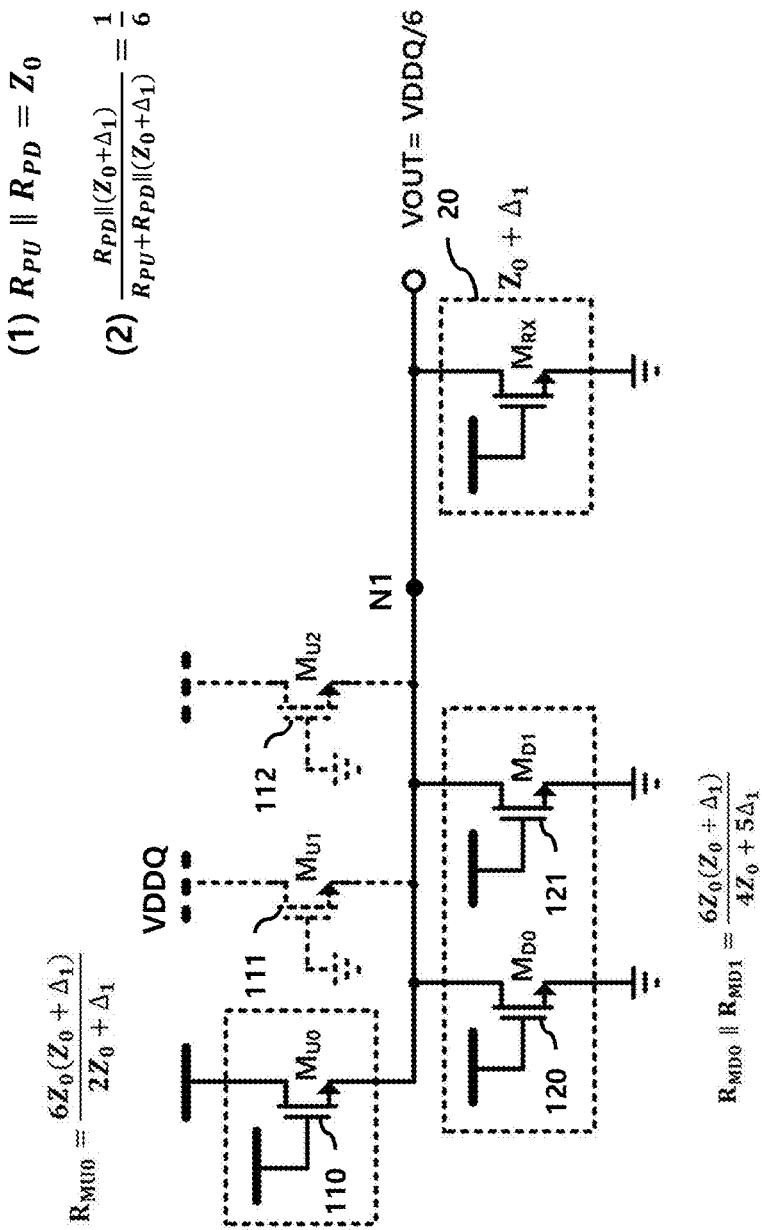

FIG. 11 illustrates a case where the multi-bit data input to the encoder 200 is "01".

When the multi-bit data is "01", the driver circuit 100 produces the output voltage VOUT having a value of ⅙ of the power supply voltage VDDQ.

In the present embodiment, when the multi-bit data is "01", the pull-up driver circuit 110 and the pull-down driver circuits 120 and 121 are turned on and the pull-up driver circuits 111 and 112 are turned off.

As described above, the number of NMOS transistors turned on in each of the pull-up driver circuit 110 and the pull-down driver circuits 120 and 121 turned on is determined by a calibration operation.

In FIG. 11, the impedance of the pull-down driver circuit 120 is represented as $R_{MD0}$.

In addition, when the multi-bit data is "01", it is assumed that the impedance of the termination resistor 20 is changed to $Z_o + \Delta_1$ due to the change of the output voltage.

As in FIG. 11, the driver circuit 100 must satisfy two conditions.

First, the output impedance of the drive circuit 100 should be equal to the characteristic impedance $Z_o$ of the channel. This is a general requirement for maximum power delivery.

Since the DC level VDDQ/6 of the output voltage VOUT of the receiver is a division of the power supply voltage VDDQ by the pull-up impedance, the pull-down impedance and the termination resistance, the second condition must be satisfied.

Given the above two conditions, the impedance of the entire pull-up driver circuit ($R_{PU}=R_{MU0}$) and the impedance of the entire pull-down driver circuit ($R_{PD}=R_{MD0}||R_{MD1}$) can be expressed using $Z_o$ and $\Delta_1$.

These expressions are shown in FIG. 11 together, and the expression development process is known to a person skilled in the art, and thus descriptions thereof are omitted.

Figure 12:
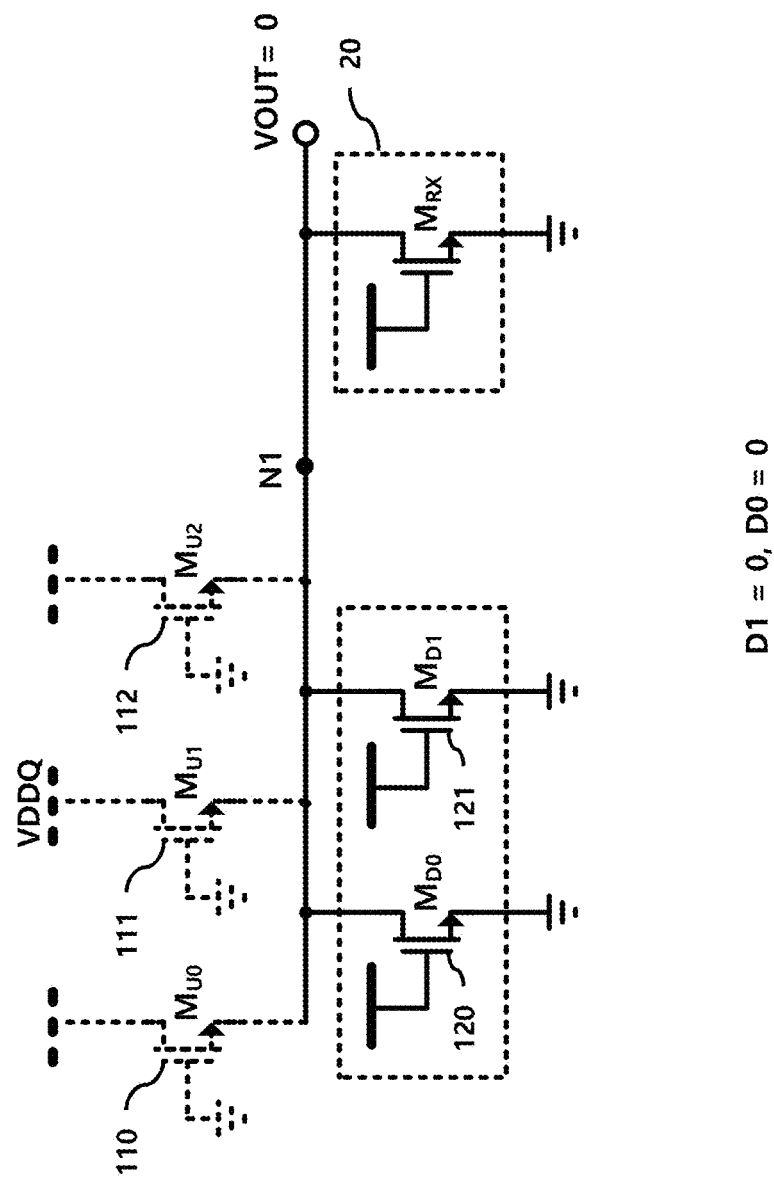

FIG. 12 illustrates a case where the multi-bit data input to the encoder 200 is "00" respectively.

When the multi-bit data is "00", the driver circuit 100 produces the output voltage VOUT having a value of a ground voltage.

In the present embodiment, when the multi-bit data is "00", the pull-up driver circuits 110 to 112 are all turned off, and the pull-down driver circuits 120 and 121 are all turned on.

Since the output voltage VOUT is the ground voltage, the driver circuit 100 does not need to satisfy special conditions.

By using mathematical expressions shown in FIGS. 9 to 12, the impedances $R_{MU0}$, $R_{MU1}$ and $R_{MU2}$ of the pull-up driver circuits 110 to 112 and the impedances $R_{MD0}$ and $R_{MD1}$ of the pull-down driver circuits 120 and 121 may be represented by $Z_o$, $\Delta_0$, and $\Delta_1$ respectively.

In the present embodiment, instead of determining the impedance of the pull-up driver circuit and the pull-down driver circuit in advance by measuring $\Delta_0$ and $\Delta_1$, number of the NMOS transistors turned on in each of the pull-up driver circuit and the pull-down driver circuit is determined by performing a calibration operation.

Figure 13:
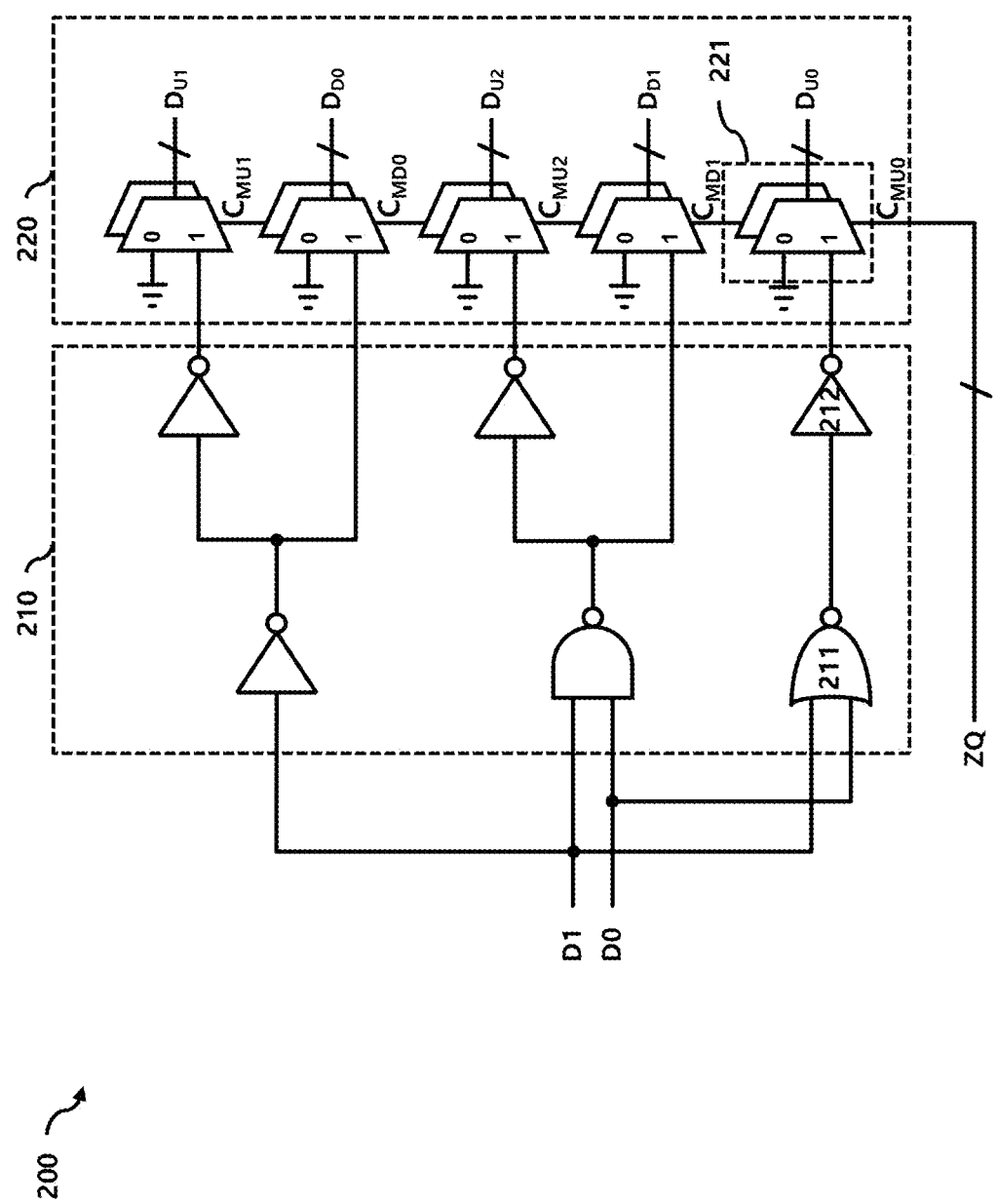
FIG. 13 is a circuit diagram of an encoder according to an embodiment of the present disclosure.

FIG. 13 is a circuit diagram illustrating an encoder 200 according to an embodiment of the present disclosure.

The encoder 200 includes an activation decision circuit 210 and a magnitude decision circuit 220.

The activation decision circuit 210 determines whether to activate each of the multi-bit control signals according to the values of bits D1 and D0 of the multi-bit data, and thus turns on or off the pull-up driver circuit and the pull-down driver circuit.

For example, when all bits of the multi-bit control signal are '0', the pull-up driver circuit or the pull-down driver circuit is turned off, and when at least one of the bits of the multi-bit control signal is '1', the pull-up driver circuit or pull-down driver circuit is turned on.

Referring to FIGS. 9 to 12, the first pull-up driver circuit 110 is turned on when the multi-bit data is "11", "10", or "01".

Accordingly, the multi-bit control signal $D_{U0}$ is a signal having a high level on one or more of its bits when D1 or D0 is "1".

Therefore, the activation decision circuit 210 includes a NOR gate 211 that performs a NOR operation on the bits D1 and D0 of the multi-bit data and an inverter 212 that inverts the output of the NOR gate 211.

The signal output from the inverter 212 is one of a plurality of logical combination signals obtained by logically combining bit D1 and D0 of the multi-bit data, and the multi-bit control signal $D_{U0}$ is provided by adjusting magnitude of the signal output from the inverter 212 at the magnitude decision circuit 220.

A magnitude selection circuit 221 included in the magnitude decision circuit 220 selects 0 or the output of the inverter 212 as the a value for each bit of the multi-bit control signal $D_{U0}$ according to corresponding bits of the calibration signal ZQ.

As such, the magnitude determination circuit 220 determines magnitude of the activated multi-bit control signal according to the calibration signal ZQ.

The turn-on impedance of the corresponding pull-up driver circuit or the pull-down driver circuit may be adjusted differently according to the magnitude of the activated multi-bit control signal.

The calibration signal ZQ may be provided as a plurality of multi-bit control signals.

In the present embodiment, the calibration signal ZQ includes a plurality of count values CMU0, CMU1, CMU2, CMD0, and CMD1 as calibration information for a plurality of multi-bit control signals.

For example, the count value CMU0 is provided to the magnitude selection circuit 221 to determine the number of bits activated in the multi-bit control signal $D_{U0}$. Thus, a first bit of the multi-bit control signal $D_{U0}$ will be equal to 0 when a first bit of the count value CMU0 is 0 and equal to the output of the inverter 212 when the first bit of the count value CMU0 is 1, a second bit of the multi-bit control signal $D_{U0}$ will be equal to 0 when a second bit of the count value CMU0 is 0 and equal to the output of the inverter 212 when the second bit of the count value CMU0 is 1, and so on. As a result, the multi-bit control signal $D_{U0}$ will have a value correspond to the count value CMU0 when the output of the inverter 212 is 1 (that is, when the first pull-up driver circuit 110 is turned on), and will have a value of 0 otherwise.

The remaining multi-bit control signals may also be determined on the same principle as described above by count values corresponding to a value of multi-bit data.

Figure 14:
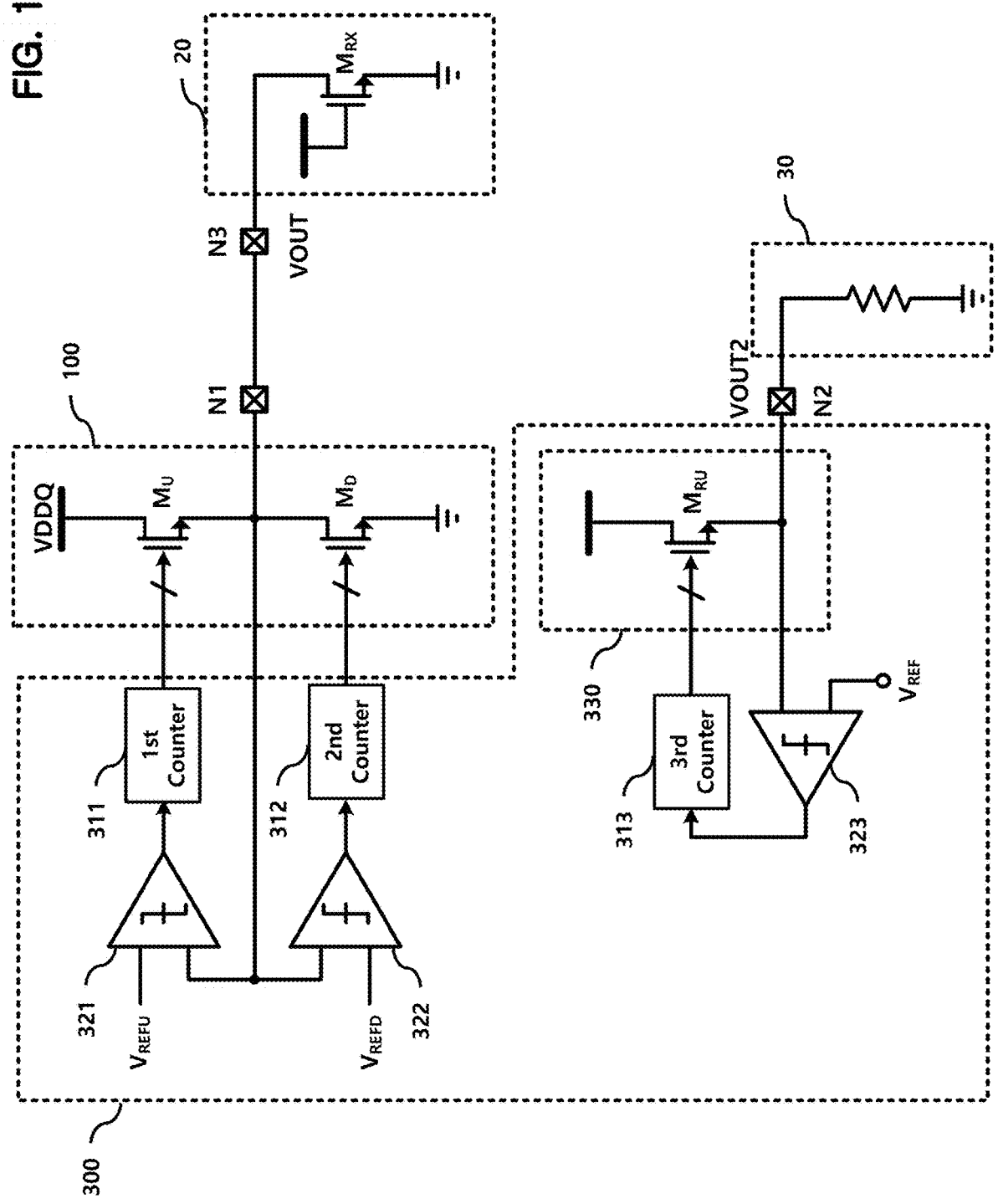
FIG. 14 is a circuit diagram of a calibration circuit according to an embodiment of the present disclosure.

FIG. 14 is a circuit diagram illustrating a calibration circuit 300 according to an embodiment of the present disclosure.

The calibration circuit 300 includes a first counter 311, a second counter 312, a third counter 313, a first comparator 321, a second comparator 322, a third comparator 323 and a replica circuit 330.

The first comparator 321 increases or decreases the value of the first counter 311 by comparing the first reference voltage $V_{REFU}$ and the output voltage VOUT.

The second comparator 322 increases or decreases the value of the second counter 312 by comparing the second reference voltage $V_{REFD}$ and the output voltage VOUT.

The third comparator 323 increases or decreases the value of the third counter 313 by comparing the reference voltage $V_{REF}$ with the calibration voltage VOUT2.

The calibration voltage VOUT2 represents the voltage of the second node N2.

The output of the first counter 311 corresponds to a multi-bit control signal for controlling the pull-up driver circuit of the driver circuit 100, and the output of the second counter 312 corresponds to a multi-bit control signal for controlling the pull-down driver circuit of the driver circuit 100.

In the drawing, the pull-up driver circuit includes all of the pull-up driver circuits 110 to 112 of FIG. 8, and these are collectively represented as an NMOS transistor $M_U$.

In the calibration operation, the output value of the first counter 311 are equally applied to the turned-on pull-up driver circuits 110 to 112.

In the drawing, the pull-down driver circuit includes all of the pull-down driver circuits 120 and 121 of FIG. 8, and these are collectively represented as an NMOS transistor $M_D$.

In the calibration operation, the output values of the second counter 312 are equally to the turned-on pull-down driver circuits 120 to 121.

The output of the third counter 313 corresponds to the multi-bit control signal for controlling the replica driver circuit 330.

In the present embodiment, wherein the calibration resistor 30 is a pull-down resistor, the replica driver circuit 330 includes a replica pull-up driver circuit that duplicates the pull-up driver circuits 110 to 112 of FIG. 8 and is turned on or turned off in the same manner as the pull-up driver circuit 110 according to the multi-bit data.

In another embodiment in which the calibration resistor 30 is a pull-up resistor, the replica driver circuit 330 may include a replica pull-down driver circuit.

For convenience, the replica pull-up driver circuit is represented as an NMOS transistor $M_{RU}$.

In the calibration operation, the output values of the third counter 313 are applied to the turned on pull-up driver circuit.

A calibration resistor 30 having the same impedance as the characteristic impedance $Z_o$ of the channel is connected to the second node N2 of the calibration circuit 300. In an embodiment, unlike the termination resistor 20, the impedance of the calibration resistor 30 does not vary in response to variations in the voltage across the calibration resistor 30.

The calibration circuit 300 performs calibration operation for each level of the output voltage corresponding to a combination of the multi-bit data to correspond to a change in the resistance value of the termination resistor 20 with respect to the change in the output voltage.

This ensures that differences between adjacent levels of the output voltage are substantially the same, that is, that the levels of the output voltage are evenly distributed.

Hereinafter, a calibration operation for determining a count value corresponding to each of the plurality of multi-bit control signals of the calibration signal ZQ will be described.

FIGS. 15 to 19 illustrate the operation of a calibration circuit according to an embodiment of the present disclosure.

As described above, the number of activated bits of the multi-bit control signal provided to the pull-up driver circuit and the pull-down driver circuit is determined through the calibration operation. Hereinafter, the number of activated bits of the multi-bit control signal corresponds to the count value.

Figure 15:
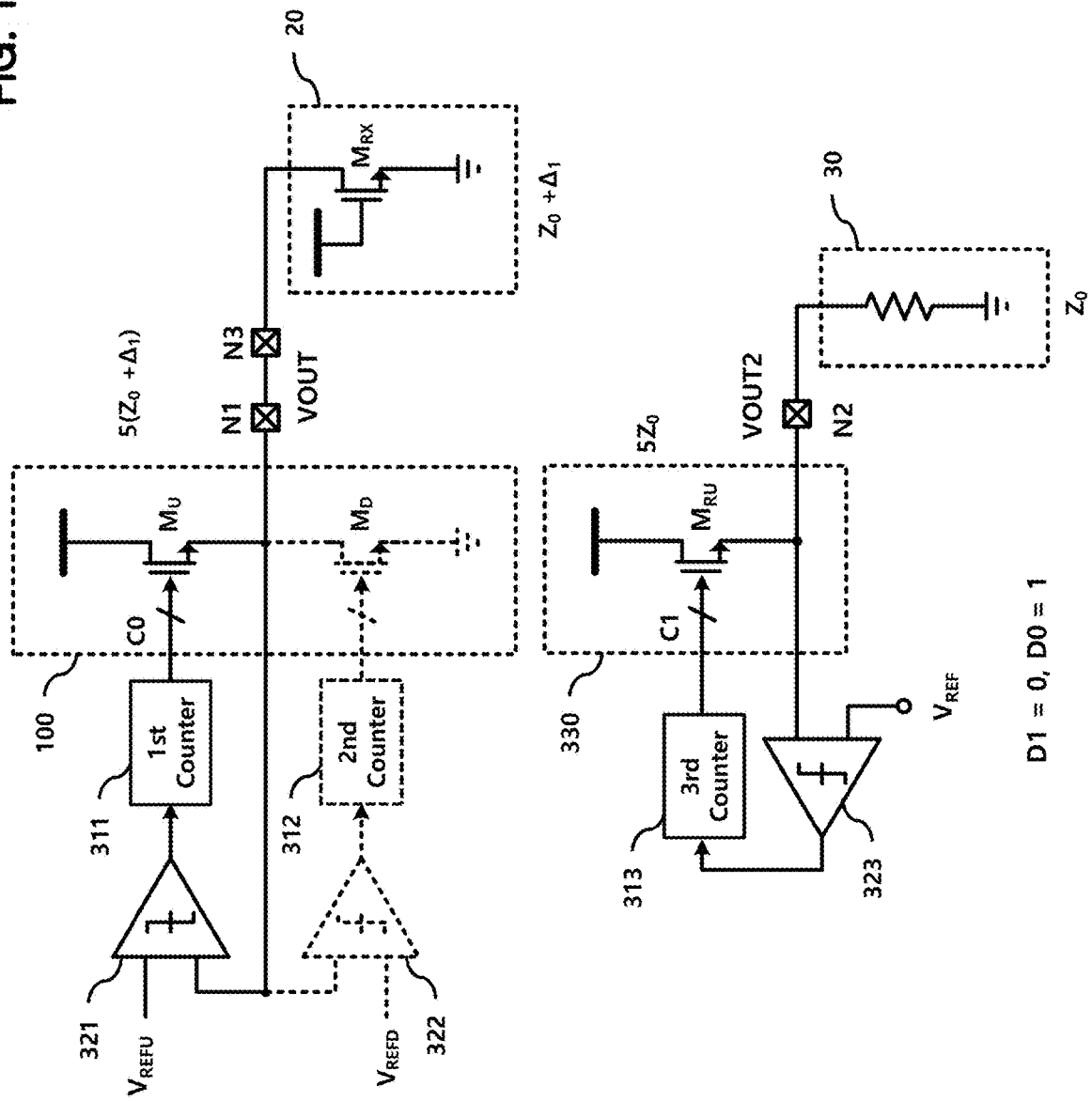
FIGS. 15, 16, 17, 18, and 19 illustrate operations of the calibration circuit according to an embodiment of the present disclosure.
Figure 16:
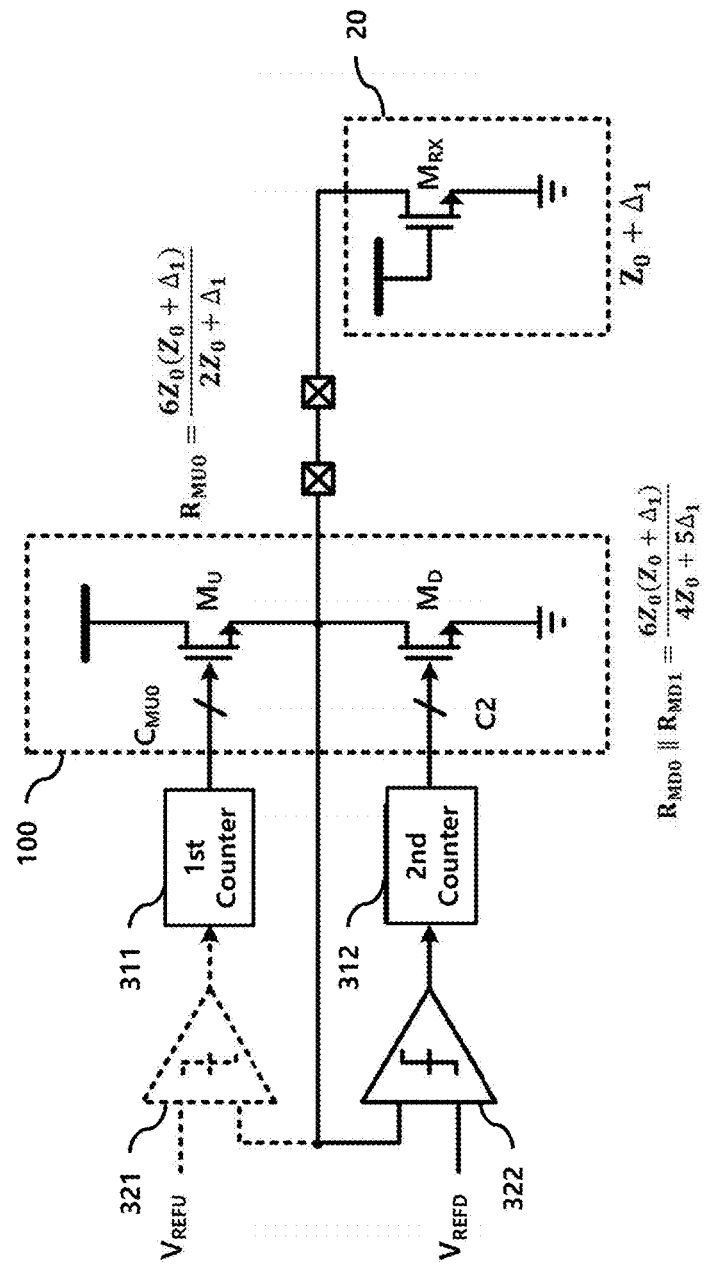

FIGS. 15 and 16 correspond to first and second steps of a calibration operation for the case where the multi-bit data is "01".

To understand the calibration operation, reference is also made to FIG. 11 which shows the driver circuit 100 in the case where the multi-bit data is "01".

In this case, the pull-up and pull-down driver circuits in both the driver circuit 100 and the replica driver circuit 330 are turned on or turned off in the same manner as the pull-up driver circuit 110 of FIG. 11 (i.e., a pull-up driver circuit 110 in the driver circuit 100 and its replica in the replica driver circuit 330 are turned on, the other pull-up drivers are turned off, and all the pull-down driver circuits in the driver circuit 100 are turned on).

In FIG. 15, a count value CMU0 corresponding to a multi-bit control signal to be provided to the pull-up driver circuit 110 is determined. As indicated by the dotted line, during the process illustrated by FIG. 15, the pull-down driver circuits in the driver circuit 100 are turned off.

In FIG. 15, the first reference voltage $V_{REFU}$ and the reference voltage $V_{REF}$ are fixed to VDDQ/6, and the value C0 of the first counter 311 and the value C1 of the third counter 313 are determined such that the output voltage VOUT and the calibration voltage VOUT2 become VDDQ/6. The value C0 of the first counter 311 may be determined by incrementing the first counter 311 while the output voltage VOUT is less than VDDQ/6 or by decrementing the first counter 311 while the output voltage VOUT is greater than VDDQ/6. The value C1 of the third counter 313 may be determined by incrementing the third counter 313 while the calibration voltage VOUT2 is less than VDDQ/6 or by decrementing the third counter 313 while the calibration voltage VOUT2 is greater than VDDQ/6.

When the output voltage VOUT and the calibration voltage VOUT2 become VDDQ/6, then because the output voltage VOUT is determined by the resistive voltage divider comprising $M_U$ and $M_{RX}$ and the calibration voltage VOUT2 is determined by the resistive voltage divider comprising $M_{RU}$ and the calibration resistor 30, the impedance of the pull-up driver circuit 110 in the driver circuit 100 is $5(Z_o+\Delta_1)$ and the impedance of the replica driver circuit 330 is $5Z_o$.

The count value C0 provided to the pull-up driver circuit 110 and the impedance of the pull-up driver circuit 110 are inversely related because a higher count value C0 corresponds to more of the parallel circuits that make up the pull-up driver circuit 110 being turned on.

In FIG. 11, the impedance $R_{MU0}$ of the pull-up driver circuit 110 is equal to the parallel connection of a resistors having an impedance of $6(Z_o+\Delta_1)$ and a resistor having an impedance of $6Z_o$ respectively. i.e. to $6(Z_o+\Delta_1)\|6Z_o$.

Accordingly, the impedance $R_{MU0}$ of the pull-up driver circuit 110 is 6/5 times greater than the resistance that would be obtained by placing the impedance of the pull-up driver circuit 110 in the driver circuit 100 if FIG. 15, i.e., $5(Z_o+\Delta_1)$, and the impedance of the replica driver circuit 330 in FIG. 15, i.e., $5Z_o$, in parallel. This is summarized in Equation 1 below.

$$R_{MU0} = \frac{6Z_0(Z_0+\Delta_1)}{2Z_0+\Delta_1} = \frac{6}{5}\{5(Z_0+\Delta_1)\|5Z_0\} \quad \text{[Equation 1]}$$

Since the impedance of the pull-up driver circuit 110 is $5(Z_o+\Delta_1)$ and the impedance of the replica driver circuit 330 is $5Z_o$, the count value CMU0 corresponding to the impedance $R_{MU0}$ may be known by using Equation 1.

Because turning on another parallel circuit in the pull-up driver circuit 110 or the replica driver circuit 330 is equivalent to adding to their respective count value and the resistance therefore decreases when the count value increases, the count value CMU0 may be determined as shown in Equation 2 below.

$$C_{MU0} = \frac{5}{6}(C0+C1) \quad \text{[Equation 2]}$$

As shown in FIG. 11, since the pull-down driver circuits 120 and 121 are turned on when D1=0 and D0=1, count values to be input to the pull-down driver circuits 120 and 121 need to be determined.

Accordingly, as shown in FIG. 16, the first comparator 321 is deactivated, the value of the first counter 311 is fixed to CMU0, and VDDQ/6 is input as the second reference voltage $V_{REFD}$ and then the value of the second counter 312 is determined by incrementing the second counter 312 while the output voltage VOUT is greater than VDDQ/6 or by decrementing the second counter 312 while the output voltage VOUT is less than VDDQ/6.

The determined value C2 of the second counter 312 corresponds to the total impedance $R_{MD0}\|R_{MD1}$ of the pull-down driver circuits 120 and 121 in FIG. 11.

If the count value corresponding to the multi-bit control signal to be provided to the pull-down driver circuit 120 is CMD0, and the count value corresponding to the multi-bit control signal to be provided to the pull-down driver circuit 121 is CMD1, the following equation 3 holds since a parallel connection of the pull-down driver circuits corresponds to adding count values.

$$C_{MD0}+C_{MD1}=C2 \quad \text{[Equation 3]}$$

Figure 17:
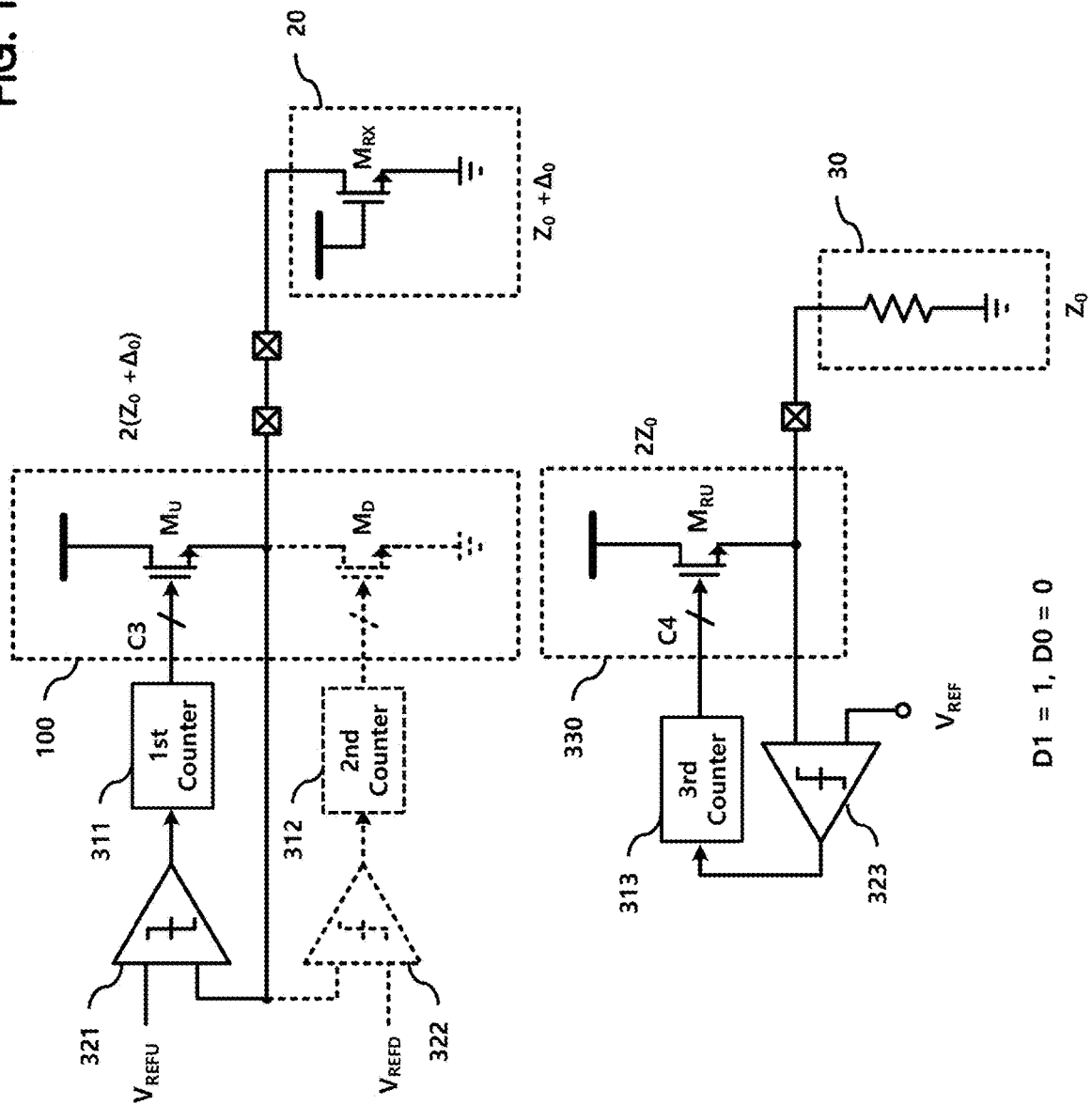
Figure 18:
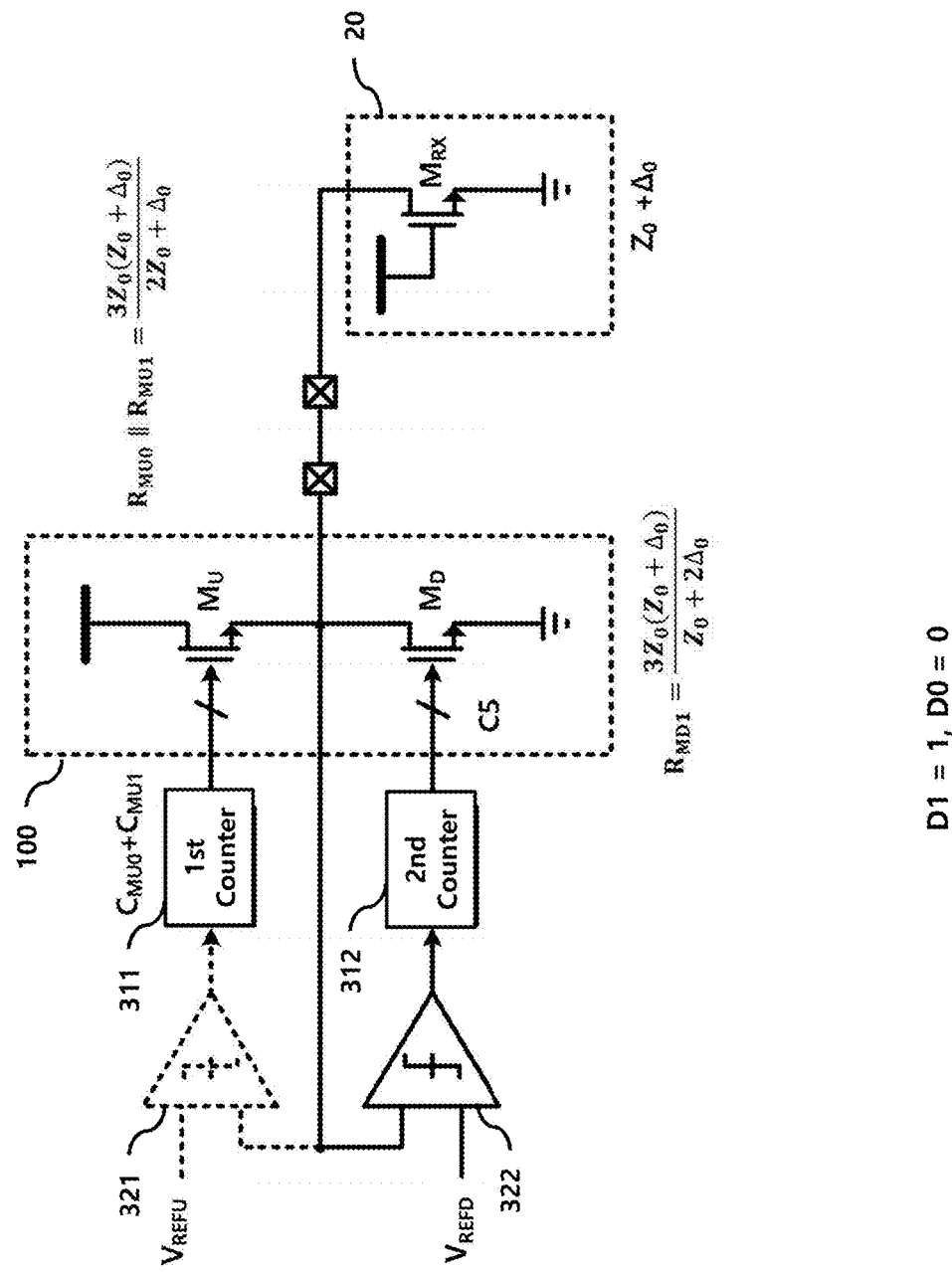

FIGS. 17 and 18 correspond to first and second steps of a calibration operation for the case where the multi-bit data is "10".

To understand the calibration operation, reference is also made to FIG. 10 which shows the driver circuit 100 in the case where the multi-bit data is "10".

In this case, the driver circuit 100 and the replica driver circuit 330 are turned on or turned off in the same manner as the pull-up driver circuit 110 of FIG. 10.

In FIG. 17, a count value CMU1 corresponding to multi-bit control signals to be provided to the pull-up driver circuit 111 are determined using, inter alia, the count value CMU0 determined in FIG. 15 for the pull-up driver circuit 110.

In FIG. 17, when the first reference voltage $V_{REFU}$ and the reference voltage $V_{REF}$ are fixed to VDDQ/3, the value C3 of the first counter 311 and the value C4 of the third counter 313 are determined such that the output voltage VOUT and the calibration voltage VOUT2 become VDDQ/3. The values C3 and C4 are determined in much the same manner as the values C0 and C1 in FIG. 15, but using VDDQ/3 instead of VDDQ/6 as the target voltage for the output voltage VOUT and the calibration voltage VOUT2.

Because the output voltage VOUT and the calibration voltage VOUT2 are generated using resistive voltage dividers, when those voltages are equal to VDDQ/3 the combined impedance of the pull-up driver circuits 110 and 110 in the driver circuit 100 is $2(Z_o+\Delta_1)$ and the impedance of the replica driver circuit 330 is $2Z_o$.

The count value C3 corresponding to the multi-bit control signal to be provided to the pull-up driver circuits 110 and 111 is inversely proportional to the combined impedance of the pull-up driver circuits 110 and 111.

Total impedance $R_{MU0}\|R_{MU1}$ of pull-up driver circuits 110 and 111 in FIG. 10 is similar to a parallel connection of a resistor whose impedance is $2(Z_o+\Delta_1)$ and a resistor whose impedance is $2Z_o$.

This is summarized in Equation 4 as below.

$$R_{MU0}\|R_{MU1} = \frac{3Z_0(Z_0+\Delta_1)}{2Z_0+\Delta_1} = \frac{3}{2}\{2(Z_0+\Delta_1)\|2Z_0\} \quad \text{[Equation 4]}$$

Equation 5 is derived based on the same principle as described above with respect to FIG. 15, and Equation 6 is derived by applying Equation 2 to Equation 5.

$$C_{MU0}+C_{MU1} = \frac{2}{3}(C3+C4) \quad \text{[Equation 5]}$$

$$C_{MU1} = \frac{2}{3}(C3+C4) - C_{MU0} \quad \text{[Equation 5.1]}$$

$$C_{MU1} = \frac{2}{3}(C3+C4) - \frac{5}{6}(C0+C1) \quad \text{[Equation 6]}$$

In FIG. 10, since the pull-down driver circuit 121 is turned on, a count value corresponding to the pull-down driver circuit 121 should be determined.

Accordingly, as shown in FIG. 18, the first comparator 321 is deactivated, the value of the first counter 311 is fixed to CMU0+CMU1, and VDDQ/3 is input as the second reference voltage $V_{REFD}$, and then the value C5 of the second counter 312 is determined in the manner that the value C2 was determined in FIG. 16, but using VDDQ/3 instead of VDDQ/6 as the target voltage for the output voltage VOUT.

The determined value C5 of the second counter 312 corresponds to the total impedance $R_{MD1}$ of the pull-down driver circuit 121 in FIG. 10.

Accordingly, the count value CMD1 corresponding to the pull-down driver circuit 121 is equal to C5 and the count value CMD0 corresponding to the pull-down driver circuit 120 is derived as shown in Equation 7 by applying C5 to Equation 3.

$$C_{MD1}=C5, C_{MD0}=C2-C5 \quad \text{[Equation 7]}$$

Figure 19:
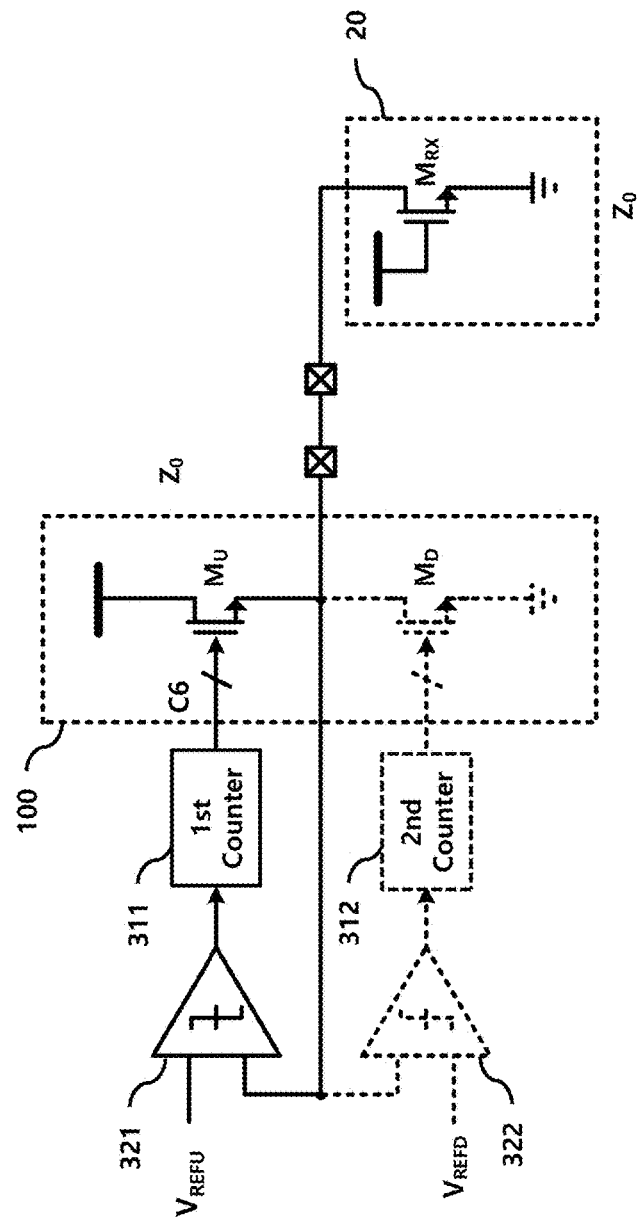

FIG. 19 corresponds to a calibration operation for the case where the multi-bit data is "11".

To understand the calibration operation, reference is also made to FIG. 9 which shows the driver circuit 100 in the case where the multi-bit data is "11".

In this case, the driver circuit 100 is turned on or turned off in the same manner as shown in FIG. 9.

In FIG. 19, CMU2 among the count values CMU0, CMU1, and CMU2 (respectively corresponding to the pull-up driver circuits 110, 111, and 112) is determined.

In FIG. 19, the first reference voltage $V_{REFU}$ is fixed to VDDQ/2, and the value C6 of the first counter 311 is determined such that the output voltage VOUT and the calibration voltage VOUT2 are VDDQ/2. The values C6 is determined in much the same manner as the values C0 in FIG. 15, but using VDDQ/2 instead of VDDQ/6 as the target voltage for the output voltage VOUT.

In addition, the impedance of the pull-up driver circuit 110 in the driver circuit 100 is $Z_o$.

When the count value C6 corresponding to the pull-up driver circuit 110 and Equation 5 are combined, a count value CMU2 is obtained as shown in Equation 8.

$$C_{MU2} = C6 - \frac{2}{3}(C3 + C4) \qquad \text{[Equation 8]}$$

As described above, a plurality of count values included in the calibration signal ZQ may be determined.

The encoder 200 generates a plurality of multi-bit control signals using the calibration signal ZQ generated as described above.

Figure 20:
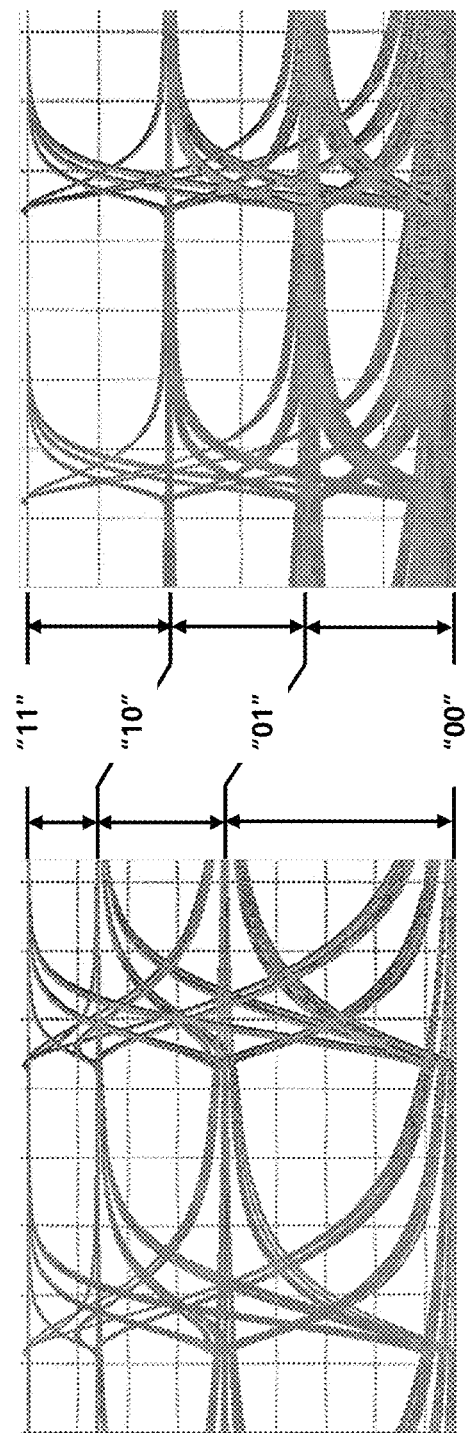
FIG. 20 is a graph showing effects of the present disclosure.

FIG. 20 is a graph showing the effect of the present embodiment.

Unlike the prior art, it can be seen that the output voltage of the multilevel signal is evenly distributed in the present embodiment, thereby improving linearity of the transmitter.

Although various embodiments have been described for illustrative purposes, various changes and modifications may be possible.

What is claimed is:

1. A transmitter comprising:
  a driver circuit configured to drive a channel connected to a first node by controlling a turn-on impedance of a pull-up path, a turn-on impedance of a pull-down path, or both according to a plurality of control signals;
  an encoder configured to generate the plurality of control signals according to a multi-bit data and a calibration signal; and
  a calibration circuit configured to generate, according to an output voltage of the driver circuit, the calibration signal including calibration information corresponding to the plurality of control signals,
  wherein the encoder determines respective activations and magnitudes of the plurality of control signals according to a plurality of bits of the multi-bit data and the calibration information.

2. The transmitter of claim 1, wherein the driver circuit comprises:
  the pull-up path including a plurality of pull-up driver circuits connected between a first power supply and the first node; and
  the pull-down path including a plurality of pull-down driver circuits connected between the first node and a second power supply,
  wherein each of the plurality of pull-up driver circuits and the plurality of pull-down driver circuits receives a corresponding control signal among the plurality of control signals thereby whose turn-on or turn-off and turn-on impedance are controlled by the multi-bit data.

3. The transmitter of claim 2, wherein a number of the plurality of pull-up driver circuits are different from a number of the plurality of pull-down driver circuits.

4. The transmitter of claim 2, wherein each of the plurality of pull-up driver circuits and the plurality of pull-down driver circuits includes a Metal-Oxide-Semiconductor (MOS) transistor having a gate receiving a corresponding control signal among the plurality of control signals.

5. The transmitter of claim 4, wherein each of the plurality of control signals is a multi-bit digital signal, and
  wherein each of the plurality of pull-up driver circuits and the plurality of pull-down driver circuits includes a plurality of MOS transistors connected in parallel, each MOS transistor including a gate receiving a corresponding bit of the corresponding control signal.

6. The transmitter of claim 4, wherein each of the plurality of pull-up driver circuits and the plurality of pull-down driver circuits includes an N-channel MOS transistor.

7. The transmitter of claim 2, wherein the calibration circuit includes:
  a first comparator configured to compare a first reference voltage with the output voltage of the driver circuit;
  a first counter configured to control the plurality of pull-up driver circuits according to a comparison result of the first comparator;
  a second comparator configured to compare a second reference voltage with the output voltage of the driver circuit;
  a second counter configured to control the plurality of pull-down driver circuits according to a comparison result of the second comparator;
  a replica driver circuit replicating a portion of the driver circuit;
  a third comparator configured to compare a third reference voltage with a calibration voltage output from an output node of the replica driver circuit; and
  a third counter configured to control the replica driver circuit according to a comparison result of the third comparator.

8. The transmitter of claim 7, wherein the replica driver circuit includes a replica pull-up driver circuit replicating the plurality of pull-up driver circuits.

9. The transmitter of claim 8, wherein the replica driver circuit further includes a calibration resistor connected between the output node of the replica driver circuit and the second power supply.

10. The transmitter of claim 7, wherein the calibration circuit performs a calibration operation by adjusting the first reference voltage, the second reference voltage and the third reference voltage for each possible value of the multi-bit data.

11. The transmitter of claim 10, wherein the calibration circuit generates the calibration information including a plurality of counter values corresponding to the plurality of control signals, and wherein each of the plurality of counter values are represented by a combination of output values from the first counter, the second counter and the third counter.

12. The transmitter of claim 11, wherein the calibration circuit is configured to determine the calibration signal by:
  setting the first reference voltage to a voltage corresponding to a first value of the multi-bit data;
  setting the third reference voltage to the voltage corresponding to a first value of the multi-bit data; and
  while the second counter is deactivated, determining a first value of the first counter and a first value of the third counter for the first value of the multi-bit data.

13. The transmitter of claim 12, wherein the calibration circuit is configured to determine the calibration signal by:
setting the second reference voltage to the voltage corresponding to a first value of the multi-bit data;
setting the value of the pull-up counter to the first value of the first counter; and
determining a first value of the second counter for the first value of the multi-bit data by operating the second comparator and the second counter while the value of the pull-up counter is the first value of the first counter the first reference voltage and second reference voltage are set to the voltage corresponding to the first value of the multi-bit data.

14. The transmitter of claim 13, wherein the calibration circuit is configured to determine the calibration signal by:
setting the first reference voltage to a voltage corresponding to a second value of the multi-bit data;
setting the third reference voltage to the voltage corresponding to a second value of the multi-bit data; and
while the second counter is deactivated, determining a second value of the first counter and a second value of the third counter for the second value of the multi-bit data.

15. The transmitter of claim 14, wherein the calibration circuit is configured to determine the calibration signal by:
setting the second reference voltage to the voltage corresponding to a second value of the multi-bit data;
setting the value of the pull-up counter with the second value of the first counter; and
determining a second value of the second counter for the second value of the multi-bit data by operating the second comparator and the second counter while the value of the pull-up counter is the second value of the first counter the first reference voltage and second reference voltage are set to the voltage corresponding to the second value of the multi-bit data.

16. The transmitter of claim 15, wherein the calibration circuit is configured to determine the calibration signal by:
determining a first multi-bit control signal of the calibration signal according to the first value of the second counter and the second value of the second counter, the first multi-bit control signal for controlling a first pull-down driver circuit of the plurality of pull-down driver circuits; and
determining a second multi-bit control signal of the calibration signal according to the second value of the second counter, the second multi-bit control signal for controlling a second pull-down driver circuit of the plurality of pull-down driver circuits.

17. The transmitter of claim 15, wherein the calibration circuit is configured to determine the calibration signal by:
setting the first reference voltage to a voltage corresponding to a third value of the multi-bit data; and
while the second counter is deactivated, determining a third value of the first counter for the third value of the multi-bit data.

18. The transmitter of claim 17, wherein the calibration circuit is configured to determine the calibration signal by:
determining a third multi-bit control signal of the calibration signal according to the first value of the first counter and the first value of the third counter, the third multi-bit control signal for controlling a first pull-up driver circuit of the plurality of pull-up driver circuits;
determining a fourth multi-bit control signal of the calibration signal according to the first value of the first counter, the second value of the first counter, the first value of the third counter, and the second value of the third counter, the fourth multi-bit control signal for controlling a second pull-up driver circuit of the plurality of pull-up driver circuits; and
determining a fifth multi-bit control signal of the calibration signal according to the second value of the first counter, the third value of the first counter, and the second value of the third counter, the fifth multi-bit control signal for controlling a third pull-up driver circuit of the plurality of pull-up driver circuits.

19. The transmitter of claim 1, wherein the encoder comprises:
an activation decision circuit configured to determine activation of each of the plurality of control signals by logically combining the plurality of bits of the multi-bit data; and
a magnitude decision circuit configured to determine magnitudes of activated control signals among the plurality of control signals by using calibration information corresponding to the plurality of control signals.

20. The transmitter of claim 19,
wherein the activation decision circuit is configured to generate a plurality of logical combination signals corresponding to the plurality of control signals by logically combining the multi-bit data, and
wherein the magnitude decision circuit includes a plurality of magnitude selection circuits configured to respectively determine magnitudes of the plurality of control signals according to the plurality of logical combination signals and the calibration information.

* * * * *